(12) United States Patent
Araki

(10) Patent No.: US 7,763,401 B2
(45) Date of Patent: Jul. 27, 2010

(54) COLORANT-CONTAINING CURABLE NEGATIVE-TYPE COMPOSITION, COLOR FILTER USING THE COMPOSITION, AND METHOD OF MANUFACTURING THE SAME

(75) Inventor: Katsumi Araki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 1112 days.

(21) Appl. No.: 11/431,502

(22) Filed: May 11, 2006

(65) Prior Publication Data

US 2006/0257763 A1    Nov. 16, 2006

(30) Foreign Application Priority Data

May 11, 2005   (JP) ............... 2005-138481

(51) Int. Cl.
*G03F 7/00* (2006.01)
*G02B 5/20* (2006.01)

(52) U.S. Cl. ............ 430/7; 430/270.1; 430/281.1; 430/287.1

(58) Field of Classification Search .............. None
See application file for complete search history.

(56) References Cited

U.S. PATENT DOCUMENTS

2005/0214679 A1 * 9/2005 Yamada .............. 430/270.1
2005/0250024 A1 * 11/2005 Fujimori .............. 430/7

FOREIGN PATENT DOCUMENTS

| JP | 09-197663 A | 7/1997 |
|---|---|---|
| JP | 2002-14221 A | 1/2002 |
| JP | 2002-278056 A | 9/2002 |
| JP | 2002-296775 A | 10/2002 |
| JP | 2003-64138 A | 3/2003 |
| JP | 2003-149801 A | 5/2003 |
| JP | 2003-277665 A | 10/2003 |
| JP | 2004-170952 A | 6/2004 |
| JP | 2004-333818 A | 11/2004 |
| JP | 2005-099658 A | 4/2005 |
| WO | WO 2005/083521 A1 * | 9/2005 |

OTHER PUBLICATIONS

Computer-generated translation of WO (JP) 2005/083521 (Sep. 2005).*
Japanese Office Action dated Apr. 13, 2010 in Japanese Application No. 2005-138481.

* cited by examiner

*Primary Examiner*—John A. McPherson
(74) *Attorney, Agent, or Firm*—Sughrue Mion, PLLC

(57) ABSTRACT

The invention provides a colorant-containing curable negative-type composition containing at least a colorant, a cross-linking agent, and a photosensitive agent and satisfying the following Condition (1) relevant to the mass of the respective components in the case the composition further contains a binder, and satisfying the following Condition (2) relevant to the mass of the respective components in the case the composition does not contain a binder:

Condition (1): wherein the mass of the binder >0,
0.45≦the mass of the colorant/[the mass of the colorant+ the mass of the cross-linking agent+the mass of the photosensitive agent+the mass of the binder]<1.0 and 2<[the mass of the cross-linking agent/the mass of the binder]; and Condition (2): wherein the mass of the binder=0,
0.45≦the mass of the colorant/[the mass of the colorant+ the mass of the cross-linking agent+the mass of the photosensitive agent]<1.0.

19 Claims, No Drawings

COLORANT-CONTAINING CURABLE NEGATIVE-TYPE COMPOSITION, COLOR FILTER USING THE COMPOSITION, AND METHOD OF MANUFACTURING THE SAME

CROSS-REFERENCE TO RELATED APPLICATION

This application claims priority under 35USC 119 from Japanese Patent Application No. 2005-138481, the disclosures of which is incorporated by reference herein.

FIELD OF THE INVENTION

The present invention relates to a colorant-containing curable negative-type composition for a color filter that is suitable for forming a colored image of a color filter for use with a liquid crystal display device, a solid image pickup element (such as a CCD or a CMOS) and the like, a color filter, and a method for manufacturing the same.

DESCRIPTION OF THE RELATED ART

As methods for manufacturing a color filter for use with a liquid crystal display device or a solid image pickup element, a dyeing methods, a printing methods, an electrodeposition methods, and a pigment dispersion methods are known.

Among these, the pigment dispersion method is a method for manufacturing a color filter by a photolithography method including using a colored radiation-sensitive composition in which pigments are dispersed in various photosensitive compositions. The pigment dispersion method has an advantage of stability against light, heat and the like, because of the useage of the pigments. In addition, because the pigment dispersion method conducts patterning by the photolithography method, it reveals gives high positioning accuracy. Therefore, the pigment dispersion method has been widely used as a method which is suitable for manufacturing color filters for a color displays of large-screens and high-precision.

In order to manufacture a color filter by the pigment dispersion method: a radiation-sensitive composition is coated on a glass substrate by means of a spin coater, a roll coater, or the like, and dried for to formation of a coating film; the coating film is exposed to light through a mask pattern, and developed for to formation of colored pixels; and this cycle of operation is repeated for each color.

A negative type photosensitive composition, which uses a photopolymerizable monomer and a photopolymerization initiator in an alkali soluble resin, is conventionally known as a specific example of the sensitive compositions used in the pigment dispersion method (see, for example, Japanese Patent Application Laid-Open (JP-A) Nos. 2-199403, 4-76062, 5-273411, 6-184482, and 7-140654).

In recent years, for applications, such as solid image pickup elements, it has been demanded that the color filter be of higher precision of the color filter has been demanded. However, it is difficult to further improve the resolution with the conventional pigment dispersion system. In addition, there are problems, such as irregular color being caused by coarse particles of the pigment. Therefore, the pigment dispersion method has not been suited for applications, such as solid image pickup elements where extremely fine patterns are required.

In order to solve the problems, examples where a solvent or water soluble dye is used have been conventionally known ((see, for example, Japanese Patent Application Laid-Open (JP-A) Nos. 2002-278056, and 2002-14221).

However, the dye-containing curable composition involves has the following problems (1) to (4):

(1) Generally, a coloring matter has a low solubility in either an alkali water solutions or an organic solvents, thus it is difficult to obtain a liquid curing composition having the desired spectrum.

(2) The dyes may often provide an interaction with other components in the curable composition, thus it is difficult to adjust the solubility (developability) of the curing part and the non-curing part (developability).

(3) When the dye has a low molar absorption coefficient ($\epsilon$), the dye must be added in a large quantity, thus it is inevitable to reduce that the amounts of the other components in the curable composition, such as the polymerizable compound (monomer), the binder, and the photopolymerization initiator, must be reduced. This presents such problems as the lowering of the curability of the composition, the heat resistance after curing, and the developability of the (non-)curing part being lowered.

(4) The dyes are generally poor inferior in light fastness and heat resistance, as compared to pigments.

In addition, especially for the application for manufacturing of a color filter for a solid image pickup element, it is required that the film thickness be 1.5 μm or less, unlike the in semiconductor manufacturing applications. Recently in the view point of performance of a device, it is strongly required that the film thickness be 1.0 μm or less, for example 0.5 to 0.8 μm. Therefore, the coloring matter must be added to the curable composition in a large quantity, which presents the same problems as mentioned above.

Because of the problems, it has been difficult in practice to meet the requirements for performance in the practical for use that is related to the in extremely fine, and thin-film colored patterns for high-precision color filters. Therefore, it has been wished to development of a dye and curable composition which can eliminate the problems has been desired.

SUMMARY OF THE INVENTION

The present invention has been made in view of the above circumstances and provides following a colorant-containing curable negative-type composition of the invention.

A first aspect of the invention is to provide a colorant-containing curable negative-type composition comprising: at least a colorant, a cross-linking agent, and a photosensitive agent, and satisfying the following Condition (1) relevant to the mass of the respective components in the case the composition further contains a binder, and satisfying the following Condition (2) relevant to the mass of the respective components in the case the composition does not contain a binder:

Condition (1): wherein the mass of the binder >0, 0.45≦the mass of the colorant/[the mass of the colorant+the mass of the cross-linking agent+the mass of the photosensitive agent+the mass of the binder]<1.0 and 2≦[the mass of the cross-linking agent/the mass of the binder]; and Condition (2): wherein the mass of the binder=0, 0.45≦the mass of the colorant/[the mass of the colorant+the mass of the cross-linking agent+the mass of the photosensitive agent]<1.0.

A second aspect of the invention is to provide a color filter obtained by using the colorant-containing curable negative-type composition of the invention.

A third aspect of the invention is to provide a method of manufacturing a color filter comprising applying the colorant-containing curable negative-type composition of the invention to a support, exposing the composition through a mask, and developing the composition for to form patterns.

DETAILED DESCRIPTION OF THE INVENTION

The present invention can provide a colorant-containing curable negative-type composition which has a high sensitivity, a high resolution, a high heat resistance, and a wide development latitude; yet is free from elution of the dye; is excellent in solvent resistance of the pattern; and with is high in productivity. Also provided is as well as a color filter using the same, and the method of manufacturing the same.

Especially, present invention is to provide a colorant-containing curable negative-type composition excellent in the molar absorption coefficient and color value of a dye, light fastness, heat resistance, pattern formability (developability), and prevention of color contamination/color omission in the manufacturing process, a color filter in form of a thin film and method of manufacturing the same.

Hereinafter, a colorant-containing curable negative-type composition, a color filter, and its manufacturing method of the invention will be described more in detail.

Colorant-Containing Curable Negative-Type Composition

The colorant-containing curable negative-type composition of the invention (hereinafter, may be referred to as composition of the invention) is a colorant-containing curable negative-type composition comprising; at least a colorant, a cross-linking agent, and a photosensitive agent, and satisfying the following Condition (1) relevant to the mass of the respective components in the case the composition further contains a binder, and satisfying the following Condition (2) relevant to the mass of the respective components in the case the composition does not contain a binder:

Condition (1): wherein the mass of the binder >0,
0.45≦the mass of the colorant/[the mass of the colorant+the mass of the cross-linking agent+the mass of the photosensitive agent+the mass of the binder]<1.0 and 2<[the mass of the cross-linking agent/the mass of the binder]; and Condition (2): wherein the mass of the binder=0,
0.45≦the mass of the colorant/[the mass of the colorant+the mass of the cross-linking agent+the mass of the photosensitive agent]<1.0.

That is, the composition of the invention may optionally contain a binder, and in the case the composition of the invention contains a binder, the composition satisfies the Condition (1) and in the case the composition of the invention contains no binder, the composition satisfies the Condition (2).

Since the composition of the invention has the feature described above, it can present excellent properties in solubility in a solvent, heat resistance, light fastness, molar absorption coefficient (color value) and pattern formability of colorant.

Since the composition of the invention can improve the unexposed part developability and the remaining film ratio of the exposed part, it has good pattern formability and gives a color filter in form of a thin film and excellent in the various properties. Further, since the composition of the invention scarcely has a risk of deterioration of the properties in the manufacturing process, its productivity is high.

As one embodiment of the invention, it is preferable to satisfy one of the following Conditions (3) to (8) as well as the Conditions (1) and (2).

Condition (3): the colorant contains at least one compound selected from an azo-based compound, a xanthene-based compound, a phthalocyanine-based compound, a triarylmethane-based compound, an anthraquinone-based compound, a quinophthalone-based compound, and an anthrapyridone-based compound.

Condition (4): the colorant contains at least one acidic dye.

Condition (5): a color value (molar absorption coefficient/molecular weight) of the colorant is 15 or more.

Condition (6): the colorant contains at least one material selected from a copper-phthalocyanine coloring material, a pyridone-azo coloring material, a pyrazolone-azo coloring material, a triarylmethane coloring material, a quinophthalone-based coloring material, and a xanthene-based compound coloring material.

Condition (7): the photosensitive agent is a photopolymerization initiator.

Condition (8): the photosensitive agent is a photo-acid generator.

The composition of the invention contains at least a colorant, a cross-linking agent, and a photosensitive agent and if necessary, a binder and a solvent.

Practically, in the case the composition of the invention is a radical polymerizable negative-type composition, the composition contains the colorant, a polymerizable compound (a monomer) as the cross-linking agent and a photopolymerization initiator as the photosensitive agent and if necessary a binder (preferably an alkali-soluble binder) and a solvent. Also, a thermal cross-linking agent as the cross-linking agent may be further contained.

In the case the composition of the invention is an acid-condensable negative-type composition, the composition contains the colorant, a compound crosslinked and condensed by an acid catalyst as the cross-linking agent, and a photo-acid generator as the photosensitive agent and if necessary a binder (preferably an alkali-soluble binder) and a solvent. Also, a thermal cross-linking agent as the cross-linking agent may be further contained.

Colorant

The composition of the invention contains a colorant. In terms of liquid-phase stability with the lapse of time, the colorant of the invention may contain at least one compound selected from an azo-based compound, a xanthene-based compound, a phthalocyanine-based compound, a triarylmethane-based compound, an anthraquinone-based compound, a quinophthalone-based compound, and an anthrapyridone-based compound and at least one acidic dye. As the colorant those having a color value (molar absorption coefficient/molecular weight) of 15 or more are preferable and those having a color value of 35 or more are more preferable. Further, as the colorant, at least one selected from a copper-phthalocyanine coloring material, a pyridone-azo coloring material, a pyrazolone-azo coloring material, a triarylmethane coloring material, a quinophthalone-based coloring material, and a xanthene-based compound coloring material is preferable.

An azomethine-based coloring material one other than the above exemplified materials is also preferable to be used. The composition of the invention may contain two or more these compounds.

Hereinafter, the colorant (coloring compound) in the invention will be described in detail.

Examples of the colorant in the invention may include conventionally known direct dyes, acidic dyes, mordant dyes/acidic mordant dyes, basic dyes, vat dyes, sulfide dyes, azoic dyes, dispersion dyes, reaction dyes, fluorescent brighteners, and other dyes, pigment resin colors, pigments, near infrared ray absorptive coloring materials, or the like described in COLOR INDEX (SOCIETY OF DYES AND COLOUR-ISTS) and DYEING NOTE (issued by SHIKISENSHA CO., LTD.).

Examples of these colorants are C.I. Solvent Blue 25, C.I. Solvent Blue 55, C.I. Solvent Blue 67, C.I. Solvent Blue 68, C.I. Solvent Blue 38, C.I. Solvent Yellow 82, C.I. Solvent Yellow 162, C.I. Solvent Orange 56, C.I. Acid Violet 17, C.I. Acid Violet 49, C.I. Direct Blue 86, and C.I. Solvent Violet 8. They may be used alone or two or more of them may be used in form of a mixture.

Acidic Dyes

Here is a description about the acidic dyes. The acidic dyes are not particularly limited, provided that they have an acid group, such as the sulfonic acid group or the carboxylic acid group, but an appropriate one of them is selected in consideration of all the necessary performances, such as a solubility in organic solvent and developing solution, a salt formability, an absorbance, an interaction with other components in the curable composition, a light fastness, and a heat resistance.

Specific examples of the acidic dyes are given below, but not limited to these. The examples include: acid alizarin violet N; acid black 1, 2, 24 or 48; acid blue 1, 7, 9, 15, 18, 23, 25, 27, 29, 40, 45, 62, 70, 74, 80, 83, 86, 87, 90, 92, 103, 108, 112, 113, 120, 129, 138, 147, 158, 171, 182, 192, or 249; acid chrome violet K; acid Fuchsin; acid green 1, 3, 5, 9, 16, 25, 27, or 50; acid orange 6, 7, 8, 10, 12, 50, 51, 52, 56, 63, 74, or 95; acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, or 274; acid violet 6B, 7, 9, 17, or 19; acid yellow 1, 3, 7, 9, 11, 17, 23, 25, 29, 34, 36, 40, 42, 54, 65, 72, 73, 76, 79, 98, 99, 111, 112, 114, 116, 169, or 243; Food Yellow 3; and derivatives of these dyes.

Among these, as the acidic dyes, the dyes, such as:

Acid Black 24; Acid Blue 7, 23, 25, 29, 62, 83, 86, 87, 90, 92, 108, 138, 158, 249; Acid Green 3, 5, 9, 16, 25, 27, 50; Acid Orange 8, 51, 56, 63, 74; Acid Red 1, 4, 8, 34, 37, 42, 52, 57, 80, 97, 114, 143, 145, 151, 183, 217; Acid Violet 7; Acid Yellow 17, 23, 25, 29, 34, 40, 42, 72, 76, 99, 111, 112, 114, 116, 169, 243, and derivatives of these dyes are preferable.

In addition, azo, xanthene, and phthalocyanine acidic dyes other than those mentioned above are preferable, and the acidic dyes, such as C.I. Solvent Blue 44, 38, C.I. Solvent Orange 45, Rhodamine B, Rhodamine 110, 3-[(5-chloro-2-phenoxyphenyl)hydrazono]-3,4-dihydro-4-oxo-5-[(phenylsulfonyl)amino]-2,7-Naphthalenedisulfonic acid, and the derivatives of these dyes are preferably used.

As the derivatives of the acidic dyes, compounds which are produced by converting the sulfonic acid of the acidic dyes into a sulfonamide or a sulfonate, and the like can be effectively used.

Atomic Group that Forms Salts with Acidic Dyes

About For the atomic group for forming a salt with the acidic dyes, there is no limitation, provided that the atomic group is a cationic one which forms a salt with the anion of the acidic dyes. Examples of such an atomic group include cations consisting of Li, Na, K, Rb, Cs, Ag, Mg, Ca, Sr, Ba, Zn, Al, Ni, Cu, Co, Fe, or a nitrogen-containing compound, and the like.

Among them are cations of H, Li, Na, K, Rb, Cs, Ag, Mg, Ca, Sr, Ba, Zn, Al, Ni, Cu, Co and Fe and cations of nitrogen-containing compounds preferable, cations of H, Na, K, Rb, Cs, Ag, Mg, Ca, Sr, Ba, Zn, Al, Cu, and Fe and cations of nitrogen-containing compounds more preferable, and cations of H, Na, K, Mg, Ca, Ba, Sr, Zn, Al, Cu, and Fe and cations of nitrogen-containing compounds even more preferable.

The cations of nitrogen-containing compounds may be selected in consideration of all of the solubility in an organic solvent and water, salt formability, absorbance and color value of dyes, and heat resistance and light fastness as a colorant. In the case of the selection only based on the absorbance and color value, the nitrogen-containing compounds are preferable to have a molecular weight as low as possible, specifically preferable to have a molecular weight of 300 or less, further more preferable to have a molecular weight of 280 or less, and even more preferable to have a molecular weight of 250 or less.

To prevent photo-discoloration and improve the heat resistance of the dye, a nitrogen-containing compound generally known as a discoloration preventing agent may be used and from this point of view, compounds having lower oxidation potential (lower ionization potential), tertiary amine compounds, alicyclic amine compounds, aniline type compounds, and hydrazine type compounds are preferable.

Hereinafter, practical examples of the nitrogen-containing compounds composing the "cations of the nitrogen-containing compounds" will be exemplified. However, the invention should not be limited to these compounds. Here, the cations are the following nitrogen-containing compounds in cationic state by protonation with one or more protons.

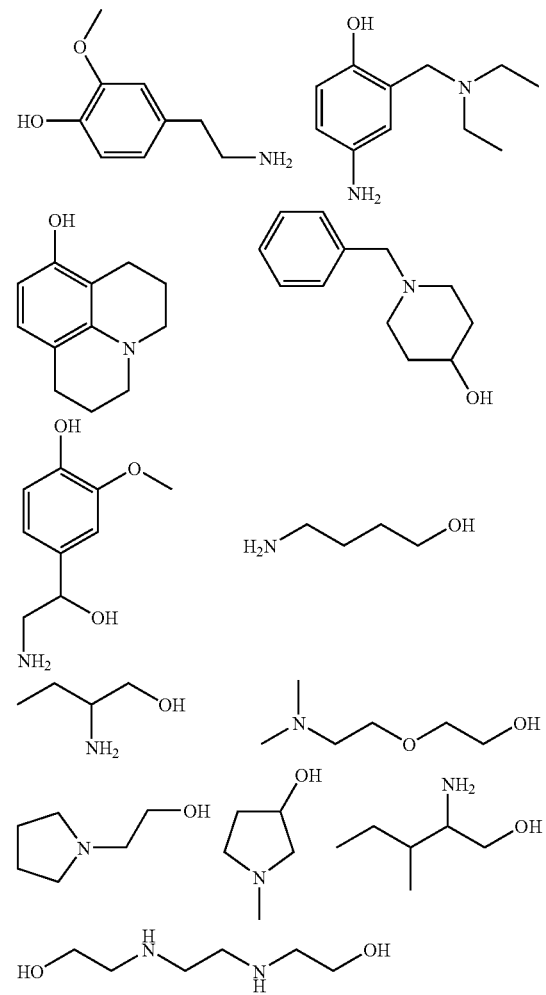

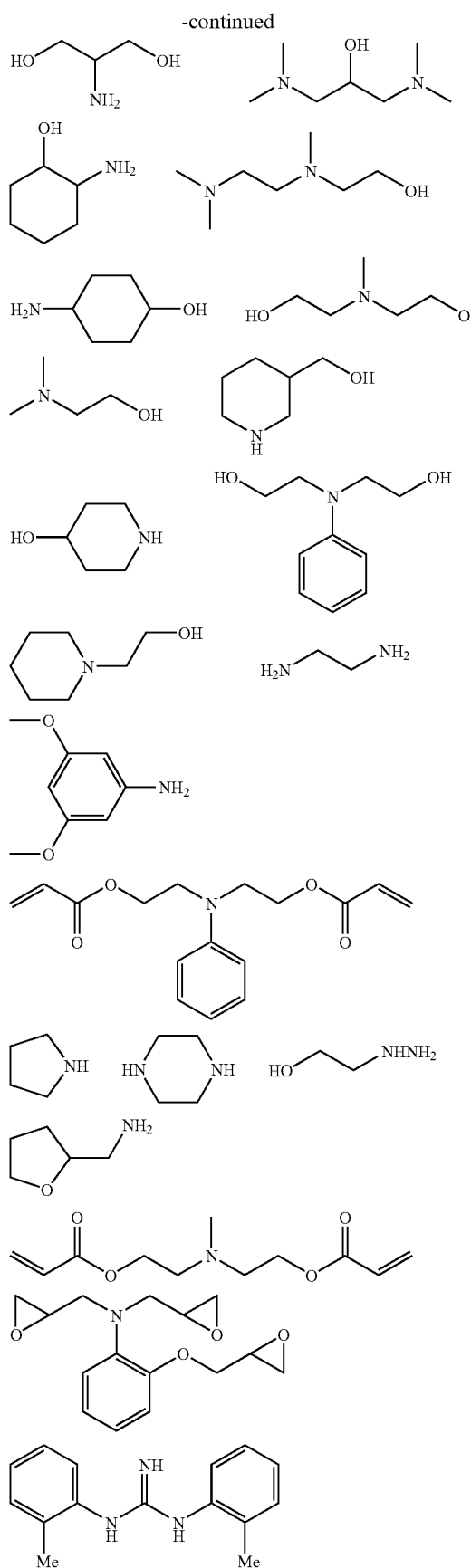
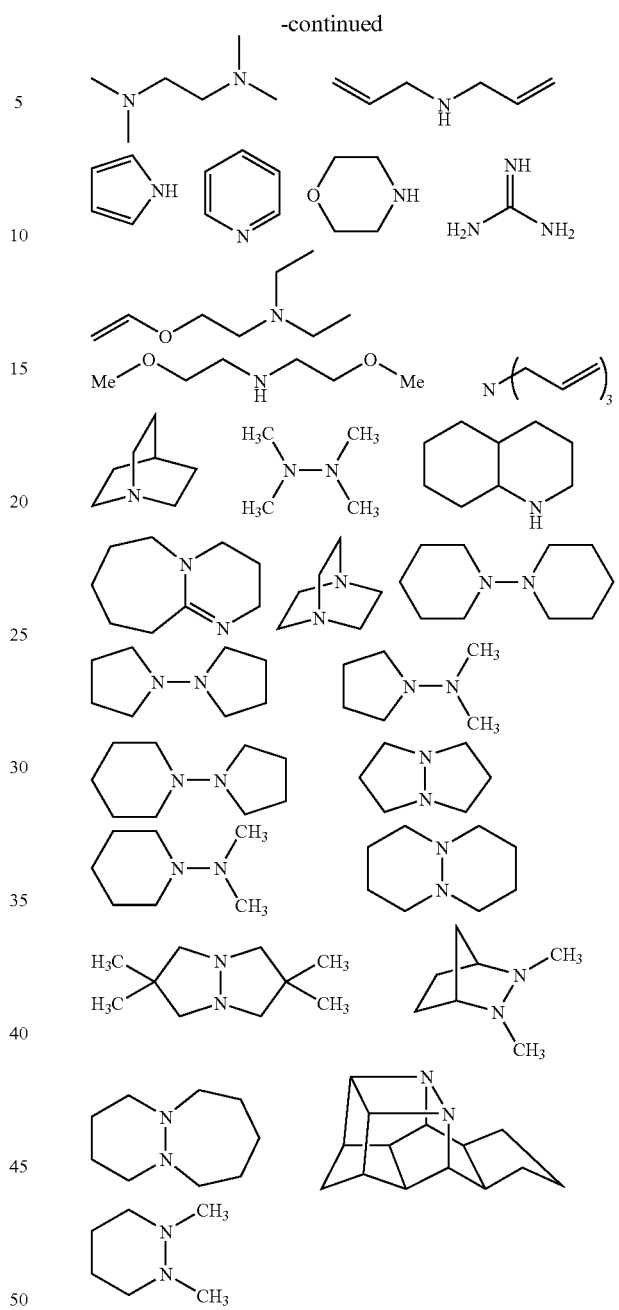

Molar Ratio (L) Between the Atomic Group Forming a Salt with an Acidic Dye and the Acidic Dye Here is an explanation of the ratio between the number of moles of an atomic group which forms a salt with an acidic dye and the number of moles of the acidic dye (hereinafter the ratio may be referred to as "L"). The L is a value determining the ratio of the moles of the acidic dye molecules to the moles of the atomic group, which is its counter ion, and can be freely selected in accordance with the salt forming conditions of the acidic dye and atomic group. Specifically, the L is a numerical value in a range of $0<L\leqq10$, and is the number of acid functional groups in the acidic dye. It is selected in consideration of all the factors, such as the solubility in organic solvent and developing solution, the salt forming properties, the absorbance, the interaction with other components in the curable composition, the light fastness, and the heat resistance. When the selection is carried out only from the viewpoint of absorbance, it is preferable for the L to take a numerical value of $0<L\leqq7$; it is more preferable for the L to take a numerical value of $0<L\leqq6$; and it is particularly preferable for the L to take a numerical value of $0<L\leqq5$.

Color Value of Colorant

The colorant is more preferable as it has higher color value (molar absorption coefficient $\varepsilon$/molecular weight Mw) since the addition amount to the dye to the resist can be saved. The color value ($\varepsilon$/Mw) is preferably 15 or more, more preferably 20 or more, furthermore preferably 30 or more, and even more preferably 35 or more.

Use Concentration

Next, the use concentration of the colorant will be described. The concentration of the colorant in the total solid components of the composition of the invention, that is although it differs depending on the types, "the mass of the colorant/[the mass of the colorant+the mass of the cross-linking agent+the mass of the photosensitive agent+the mass of the binder] (including the case no binder is used (the mass of the binder=0))" is in a range from 0.45 or more and less than 1.0, preferably from 0.45 or more and 0.99 or less, more preferably 0.45 or more and 0.95 or less, and even more preferably 0.45 or more and 0.90 or less.

If "the mass of the colorant/[the mass of the colorant+the mass of the cross-linking agent+the mass of the photosensitive agent+the mass of the binder] (including the case no binder is used (the mass of the binder=0))" is less than 0.45, it becomes impossible to keep sufficient color density in the case of forming a thin film and if it is 1.0 or more, it becomes impossible to provide sufficient curability.

Cross-Linking Agent

Next, the cross-linking agent in the invention will be described. In the invention, "cross-linking agent" means those forming bonds and forming cross-linking structures. The cross-linking agent in the invention includes, for example, a polymerizable compound, which will be described later, a thermal cross-linking agent, and a compound to be crosslinked and condensed by an acid catalyst.

Note that "the mass of the cross-linking agent" in the conditions (1) and (2) means the total amount of the cross-linking agent and for example, in the case a thermal cross-linking agent is used in combination with a polymerizable compound, it means the total of these compounds.

Polymerizable Compound

The polymerizable compound (hereinafter, referred to as "monomer") will be described. The monomer is used together with a photopolymerization initiator, which will be described later, in the case the composition of the invention is a radical polymerizable negative-type composition.

As the monomer, a compound which has at least one addition-polymerizable ethylene group, has a boiling point of 100° C. or more under normal pressure, and has an ethylenic unsaturated group, is preferable. Examples thereof include: monofunctional acrylates and methacrylates such as polyethylene glycol mono(meth)acrylate, polypropylene glycol mono(meth)acrylate, phenoxyethyl (meth)acrylate; polyethylene glycol di(meth)acrylates; trimethylol ethane tri(meth) acrylates; neopentyl glycol di(meth)acrylates; pentaerythritol tri(meth)acrylates; pentaerythritol tetra(meth)acrylates; dipentaerythritol penta(meth)acrylates; dipentaerythritol hexa(meth)acrylates; hexanediol (meth)acrylates; trimethylol propane tri(acryloyloxypropyl) ether; tri(acryloyloxyethyl)isocyanulate; compounds obtained by adding ethylene oxides, propylene oxides or the like to multifunctional alcohols, such as glycerin or trimethylol ethane, and then (meth) acrylating the resultant of the reaction; urethane acrylates such as those disclosed in Japanese Patent Application Publication (JP-B) Nos. 48-41708 and 50-6034 or Japanese Patent Application Laid-Open (JP-A) No. 51-37193; polyester acrylates such as those disclosed in Japanese Patent Application Laid-Open (JP-A) No. 48-64183, Japanese Patent Application Publication (JP-B) Nos. 49-43191 and 52-30490; and multifunctional acrylates or methacrylates, such as epoxyacrylates, which are reaction products of epoxy resins and (metha)acrylic acids, and mixtures thereof. Further, examples thereof includes those introduced as light curable monomers and oligomers in Journal of the Adhesion Society of Japan, Vol. 20, No. 7, pp. 300 to 308.

As the monomer, the (meth)acrylic ester monomer is preferable, and the quadrifunctional or more (meth)acrylic ester monomer is particularly preferable.

The content of the monomer in the composition of the present invention is so determined as to satisfy the above Conditions (1) to (2) and it is preferably 0.1 to 55% by mass, more preferably 1.0 to 55% by mass, and particularly preferably 2.0 to 55% by mass with respect to the solid content of the composition.

Compound Crosslinked and Condensed by Acid Catalyst

In the case the composition of the invention is an acid-condensable negative-type composition, as the cross-linking agent is used a compound crosslinked and condensed by an acid catalyst. The compound crosslinked and condensed by an acid catalyst includes, for example, a melamine compound, which will be described later as a thermal cross-linking agent.

The content of the compound crosslinked and condensed by an acid catalyst in the composition in the invention is so determined as to satisfy the above Conditions (1) and (2) and it is preferably 0.1 to 55% by mass, more preferably 1.0 to 55% by mass, and even more preferably 2.0 to 55% by mass in the total solid matter of the composition.

Thermal Cross-Linking Agent

Next, the thermal cross-linking agent will be described. The invention provides a film with good curability by advantageously promoting the curing reaction of the film by using the composition as compared with a conventional composition, and it is also possible for the invention to obtain a highly advantageously cured film by using a thermal cross-linking agent as a supplementary agent.

Herein, "thermal cross-linking agent" means an agent to form a bond by stimulation of heat, and thereby form a crosslinked structure. The thermal cross-linking agent to be used in the invention is not particularly limited if it can cure a film by crosslinking reaction and may include (a) an epoxy resin; (b) a melamine compound, a guanamine compound, a glycol uryl compound or an urea compound substituted with at least one substituent group selected from a methylol group, an alkoxymethyl, and an acyloxymethyl; and (c) a phenol compound, a naphthol compound, or a hydroxyanthracene compound substituted with at least one substituent group selected from a methylol group, an alkoxymethyl, and an acyloxymethyl and especially a polyfunctional epoxy resin is preferable.

As the (a) epoxy resin, any compounds can be used with no particular restrictions, provided that they have an epoxy group and crosslikability. Examples of these compounds include: low-molecular weight compounds containing a divalent glyidyl group, such as bisphenol-A-diglycidylether, ethyleneglycol diglycidylether, butanediol diglycidylether, hexanediol diglycidylether, dihydroxybiphenyl diglycidylether, phthalic acid diglycidylether, or N,N-diglycidyl aniline; low-molecular weight compounds containing a trivalent glyidyl group, represented by trimethylolpropane triglycidylether, trimethylolphenol triglycidylether, TRISP-PA (trade name, manufactured by Honshu Chemical Industry Co., Ltd.)-triglycidylether, or the like; low-molecular weight compounds containing a tetravalent glycidyl group, represented by pentaerythritol tetraglycidylether, tetramethylol bisphenol-A-tetraglycidylether, or the like; polyvalent low-molecular weight compounds containing a polyvalent glycidyl group, such as dipentaerythritol pentaglycidylether, dipentaerythritol hexaglycidylether, or the like; high-molecular weight compounds containing a glycidyl group, represented by polyglycidyl (meth)acrylate, a 1,2-epoxy-4-(2-oxylanyl) cyclohexane addition product of 2,2-bis(hydroxymethyl)-1-butanol, or the like.

With regard to a number of the methylol group, alkoxymethyl group or acyloxymethyl group which substitutes the (b) compound, the melamine compound is substituted with 2 to 6 of these substituents, and each of the glycoluryl compound, the guanamine compound, and the urea compound is substituted with 2 to 4 of these substituents. It is preferable that the melamine compound is substituted with 5 to 6 of these substituents, and each of the glycoluryl compound, the guanamine compound, and the urea compound is substituted with 3 to 4.

These methylol-group containing compounds can be obtained by heating the alkoxymethyl-group containing compounds in the presence of an acidic catalyst, such as hydrochloric acid, sulfuric acid, nitric acid, or methansulfonic acid, in alcohol. The acyloxymethyl-group containing compound can be obtained by mixing a methylol-group containing compound with acylchloride and mixing them by stirring in the presence of a basic catalyst.

Hereinafter, specific examples of the (b) compound having substituents are mentioned.

Examples of the melamine compound include a hexamethylol melamine, hexamethoxymethyl melamine, compounds in which 1 to 5 methylol groups of hexamethylol melamine are methoxymethylized or mixtures thereof, hexamethoxyethyl melamine, hexaacyloxymethyl melamine, compounds in which 1 to 5 methylol groups of hexamethylol melamine are acyloxymethylized or mixtures thereof, and the like.

Examples of the guanamine compound include tetramethylol guanamine, tetramethoxymethyl guanamine, compounds in which 1 to 3 methylol groups of tetramethylol guanamine are methoxymethylized or mixtures thereof, tetramethoxyethyl guanamine, tetraacyloxymethyl guanamine, compounds in which 1 to 3 methylol groups of tetramethylol guanamine are acyloxymethylized or mixtures thereof, and the like.

Examples of the glycoluryl compound include tetramethylol glycoluryl, tetramethoxymethyl glycoluryl, compounds in which 1 to 3 methylol groups of tetramethylol glycoluryl are methoxymethylized or mixtures thereof, compounds in which 1 to 3 methylol groups of tetramethylol glycoluryl are acyloxymethylized or mixtures thereof, and the like.

Examples of the urea compound include tetramethylol urea, tetramethoxymethyl urea, compounds in which 1 to 3 methylol groups of tetramethylol urea are methoxymethylized or mixtures thereof, tetramethoxyethyl urea, and the like. These may be used alone or in combination of two or more thereof.

The phenolic compound, naphtholic compound, and hydroxyanthracene compound which are categorized as the (c) compound, being substituted by at least one substituent selected from the group consisting of the methylol group, alkoxymethyl group, and acyloxymethyl group suppress intermixing with an overcoated photoresist by a thermal crosslinking, and further enhance a film strength, as are the case with the (b) compound.

It is necessary that one molecule of the compound (c) includes at least two groups of those selected from the group consisting of the methylol groups, alkoxymethyl groups and acyloxymethyl groups. From the viewpoints of thermal crosslinkability and storage stability, it is preferable that the compound (c) is a phenolic compound in which all of the second and fourth positions are substituted.

Further, it is preferable that the naphtholic compound and the hydroxyanthracene compound, which becomes a skeleton of the compound (c), is substituted at all the ortho and para positions thereof by —OH groups.

The third or fifth position of the phenolic compound, which provides a skeleton of the compound (c), may be substituted or unsubstituted. With regard to the naphtholic compound, which provides the skeleton of the compound (c), the positions other than the ortho positions of —OH groups may be substituted or unsubstituted.

The methylol-group containing compounds can be obtained by using a compound with which the ortho or para position (the second or fourth position) relative to the phenolic —OH group is a hydrogen atom as a raw material, and causing it to react with formalin in a presence of a basic catalyst, such as sodium hydroxide, potassium hydroxide, ammonia, or tetraalkyl ammonium hydroxide.

In addition, the alkoxymethyl-group containing compounds can be obtained by heating the methyrol-group containing compounds in a presence of an acidic catalyst, such as hydrochloric acid, sulfuric acid, nitric acid, or methansulfonic acid, in alcohol.

The acyloxymethyl-group containing compounds can be obtained by causing the methyrol-group containing compounds to react with acylchloride in a presence of a basic catalyst.

Examples of the skeleton compound include a phenolic compound, naphthol, and a hydroxyanthracen compound in which ortho or para positions relative to a phenolic —OH group thereof is unsubstituted, and specific examples thereof include a phenol, crezol, isomers thereof, 2,3-xylenol, 2,5-xylenol, 3,4-xylenol, 3,5-xylenol, bisphenols such as bisphenol-A, 4,4'-bishydroxybiphenyl, TRIS P-PA (described above), naphthol, dihydroxynaphthalen, 2,7-dihydroxyanthracen and the like.

Specific examples of the (c) compound include a trimethylol phenol, tri(methoxymethyl)phenol, trimethylol phenol, compounds in which 1 or 2 methylol groups of trimethylol phenol are methoxymethylized, trimethylol-3-crezol, tri(methoxymethyl)-3-crezol, compounds in which 1 or 2 methylol groups of trimethylol-3-crezol are methoxymethylized, dimethylol crezols such as 2,6-dimethylol-4-crezol, tetramethylol bisphenol-A, tetramethoxymethyl bisphenol-A, compounds in which 1 to 3 methylol groups of tetramethylol bisphenol-A are methoxymethylized, tetramethylol-4,4'-bishydroxybiphenyl, tetramethoxymethyl-4,4-bishydroxybiphenyl, hexamethylol species of TRISP-PA (described above), hexamethoxymethyl species TRIS P-PA (described above), compounds in which 1 to 5 methylol groups of hexamethylol species of TRIS P-PA (described above) are methoxymethylized, bishydroxymethyl naphthalenediol, and the like.

Examples of the hydroxyanthracen compound include a 1,6-dihydroxymethyl-2,7-dihydroxyanthracen, and the like.

Examples of the acyloxymethyl-group containing compounds include compounds in which a part or all of the methylol groups of the methylol-group containing compounds are acyloxymethylized.

Among these compounds, a trimethylol phenol, bishydroxymethyl-p-crezol, tetramethylol bisphenol-A, hexamethylol species of TRIS P-PA (described above), or phenolic compounds in which the hexamethylol groups of these compounds are substituted by an alkoxymethyl group and both a methylol group and an alkoxymethyl group. These may be used alone or in combination of two or more thereof.

The content of the thermal cross-linking agent (components (a) to (c)) in the composition of the invention differs depending on the materials and is so determined as to satisfy the above Conditions (1) to (2) and it is preferably 0 to 55% by mass, more preferably 0 to 50% by mass, and even more preferably 0 to 45% by mass in the total solid matter.

Photosensitive Agent

Next, the photosensitive agent to be added to the composition of the invention will be described. The photosensitive agent may include a photopolymerization initiator in the case the composition of the invention is radical polymerizable negative-type composition and a photo-acid generator in the case the composition of the invention is an acid-condensable negative-type composition.

The photosensitive agent is not particularly limited if it can crosslink the cross-linking agent, however it is preferable to be selected in terms of the properties, initiating efficiency, absorption wavelength, availability, and cost. Photopolymerization initiator Next, the photopolymerization initiator to be contained when the composition of the present invention is a negative composition will be described. The photopolymerization initiator is not particularly limited, provided that it allows the monomers having polymerizability to be polymerized, however, it is preferable that the photopolymerization initiator is selected from the viewpoints of characteristics, initiation efficiency, absorption wavelength, availability, cost, and the like.

Examples of the photopolymerization initiator include a trihalomethyltriazine compound, a benzyldimethylketal compound, an α-hydroxyketone compound, an a aminoketone compound, a phosphine oxide compound, a metalocen compound, an oxime compound, a triallyl imidazole dimer, a benzothiazole compound, a benzophenone compound, an acetophenone compound and its derivative, a cyclopentadien-benzene-ferrous complex and its salt, a halomethyloxadiazole compound, and a 3-aryl-substituted coumarin compound, and the like, and the photopolymerization initiator preferably comprises at least one compound selected from the group consisting of the α-aminoketone compound, the phosphine oxide compound, the metalocen compound, the oxime compound, and the triallyl imidazole dimer.

In addition, it is preferable that the photopolymerization initiator is a compound which does not generate an acid by decomposition.

Examples of the active halogen compound, such as the halomethyloxadiazole compound, include 2-halomethyl-5-vinyl-1,3,4-oxadiazole compound and the like as disclosed in Japanese Patent Application Publication (JP-B) No. 57-6069, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, and the like.

Examples of the trihalomethyl-s-triazine compound photopolymerization initiator include vinyl-halomethyl-s-triazine compounds as disclosed in Japanese Patent Application Publication (JP-B) No. 59-1281, 2-(naphtho-1-yl)-4,6-bis-halomethyl-s-triazine compounds and 4-(p-aminophenyl)-2,6-di-halomethyl-s-triazine compounds as disclosed in Japanese Patent Application Laid-Open (JP-A) No. 53-133428, and the like.

Other examples thereof include a 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methylphenyl)-1,3,5-triazine, 2,4-bis(trichloromethyl)-6-(1-p-di methylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-ethoxy-naphtho-1-yl)-4,6-bis-trichloromethyl-s-triazine, 2-(4-buthoxy-naphtho-1-yl)4,6-bis-trichloromethyl-s-triazine, 2-[4-(2-methoxyethyl)-naphtho-1-yl]4,6-bis-trichloromethyl-s-triazine, 2-[4-(2-ethoxyethyl)-naphtho-1-y 1]4,6-bis-trichloromethyl-s-triazine, 2-[4-(2-buthoxyethyl)-naphtho-1-yl]4,6-bis-trichloromethyl-s-triazine, 2-(2-methoxy-naphtho-1-yl)4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(tri chloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-tri azine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and the like.

In addition to these, TAZ series manufactured by Midori Kagaku Co., Ltd., including TAZ-107, TAZ-110, TAZ-104, TAZ-109, TAZ-140, TAZ-204, TAZ-113, TAZ-123, and TAZ-104 (all trade names, manufactured by Midori Kagaku Co., Ltd.); T series manufactured by Panchim Ltd., including T-OMS, T-BMP, T-R, and T-B (all trade names, manufactured by Panchim Ltd.); IRGACURE® series manufactured by Ciba Specialty Chemicals Inc., including IRGACURE® 651, IRGACURE® 184, IRGACURE® 500, IRGACURE® 1000, IRGACURE® 149, IRGACURE® 819, and IRGACURE® 261; DAROCUR® series manufactured by Ciba Specialty Chemicals Inc., including DAROCUR® 11734; 4'-bis(diethylamino)-benzophenone, 2-(o-benzoyloxime)-1-[4-(phenylthio)phenyl]-1,2-octanedione, 2-benzyl-2-dimethylamino-4-morpholinobuthylophenone, 2,2-dimethoxy-2-phenylacetophenone, 2-(o-chlorphenyl)-4,5-diphenylimidazolyl dimer, 2-(o-fluorophenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoinisopropylether, and the like can be usefully used.

Examples of the α-aminoketone compound include IRGACURE® series manufactured by Ciba Specialty Chemicals Inc. (such as IRGACURE®907 or IRGACURE® 369), 2-methyl-1-phenyl-2-morpholinopropane-1-on, 2-methyl-1-[4-(hexyl)phenyl]-2-morpholinopropane-1-on, 2-ethyl-2-dimethylamino-1-(4-morpholinophenyl)-butanone-1, and the like.

The oxime compound is not particularly limited, however, preferable examples include 2-(O-benzoyloxime)-1-[4-(phenylthio)phenyl)-1,2-octanedione, 1-(4-methylsulfanyl-phenyl)-butane-1,2-butane-2-oxime-O-acetate, 1-(4-methylsulfanyl-phenyl)-butane-1-onoxime-O-acetate, hydroxyimino-(4-methylsulfanyl-phenyl)-acetic acid ethyl ester-O-acetate, hydroxyimino-(4-methylsulfanyl-phenyl)-acetic acid ethyl ester-O-benzoate, and the like.

In addition, regarding other photopolymerization initiators, preferable examples of the benzylmethylketal compound include IRGACURE® 651; those of the α-hydroxyketone compound include IRGACURE® 184, IRGACURE® 1173, IRGACURE® 500, IRGACURE® 1000, and IRGACURE® 2959; those of the α-aminoketone compound include IRGACURE® 907 and IRGACURE® 369; those of the phosphine oxide compound (blend) include IRGACURE® 1700, IRGACURE® 149, IRGACURE® 1850, IRGACURE® 819, and IRGACURE® 814; those of the metalocen compound include IRGACURE® 784 and IRGACURE® 261 (all manufactured by Ciba Specialty Chemicals Inc.), from the viewpoints of availability and stability, and the analogs/peripheral compounds for these, and the like are also preferable.

As described above, from the viewpoints of light fastness and heat resistance of the dye, it is preferable to use a compound which does not generate an acid by decomposition. Namely, it is preferable to use at least one compound selected from the group consisting of a benzylmethylketal compound, an α-hydroxyketone compound, an α-aminoketone compound, a phosphine oxide compound, a metalocen compound, an oxime compound, a triallylimidazole dimer, a benzothiazole compound, a benzophenone compound, a acetophenone compound and its derivative, and a cyclopentadiene-benzene-ferrous complex and its salt as the compound which does not generate an acid by decomposition. It is further preferable to use at least one compound selected from the group consisting of an α-aminoketone compound, a phosphine oxide compound, a metalocen compound, an oxime compound, and a triallylimidazole dimer.

These photopolymerization initiators can be used in combination with sensitizers and light stabilizers.

Specific examples of the sensitizers and light stabilizers include: benzoin, benzoinmethylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-methoxyxanthone, thioxanthone, 2,4-diethylthioxanthone, acridone, 10-butyl-2-chloroacridone, benzyl, dibenzalacetone, p-(dimethylamino)phenylstyrylketone, p-(dimethylamino)phenyl-p-methylstyrylketone, benzophenone, p-(dimethylamino) benzophenone(or Michler's ketone), p-(dimethylamino) benzophenone, benzoanthron, and the like; benzothiazole compounds and the like as disclosed in Japanese Patent Application Publication (JP-B) No. 51-48516; TINUVIN® 1130 and TINUVIN® 400 (both manufactured by Ciba Specialty Chemicals); and the like.

In addition to the photopolymerization initiators, commonly-known photopolymerization initiators can be used in the composition of the present invention.

Specific examples thereof include vicinalpolyketolaldonyl compounds as disclosed in U.S. Pat. No. 2,367,660; α-carbonyl compounds as disclosed in U.S. Pat. Nos. 2,367,661 and 2,367,670; acyloinethers as disclosed in U.S. Pat. No. 2,448,828; aromatic acyloin compounds substituted by α-hydrocarbon groups as disclosed in U.S. Pat. No. 2,722,512; multicore quinone compounds as disclosed in U.S. Pat. Nos. 3,046,127 and 2,951,758; combinations of triallylimidazole dimers and p-aminophenylketones as disclosed in U.S. Pat. No. 3,549,367; benzothiazole compounds and trihalomethyl-s-triazine compounds as disclosed in Japanese Patent Application Publication (JP-B) No. 51-48516, and the like.

The amount of the photopolymerization initiator is so determined as to satisfy the Conditions (1) and (2) and it is preferably 0.01% by mass to 50% by mass, more preferably 1% by mass to 40% by mass, and even more preferably 1% by mass to 30% by mass in the solid matters of the monomers. If the amount of the photopolymerization initiator is within a range from 0.01% by mass to 50% by mass, the molecular weight is prevented from becoming too small and accordingly the film strength is prevented from becoming low.

A thermal polymerization inhibitor is preferably added to the composition of the present invention.

Examples of the thermal polymerization inhibitor include hydroquinone, p-methoxyphenol, di-t-butyl-p-crezol, pirrogalol, t-butylcatechol, benzoquinone, 4,4'-thiobis(3-methyl-6-t-butylphenol), 2,2'-methylenebis(4-methyl-6-t-butylphenol), 2-mercaptobenzoimidazole, and the like.

Photo-Acid Generator

In the case the composition of the invention is an acid-condensable negative-type composition [an acid catalyst-curable type (a system in which an acid is generated from a photosensitive agent (a photo-acid generator) by exposure and crosslinking reaction is promoted using the generated acid as a catalyst)], the photo-acid generator is used as the photosensitive agent in combination with the compound (cross-linking agent) to be crosslinked and condensed by the acid catalyst.

The photo-acid generator is not particularly limited if it is a compound generating an acid by exposure and examples may include various oxime-based compounds such as α-(4-toluenesulfonyloxyimino)phenylacetonitrile, various iodonium compounds, various sulfonium compounds, and various trihalomethyltriazine compounds.

The amount of the photo-acid generator is so determined as to satisfy the Conditions (1) and (2), and it is preferably 0.01 to 50% by mass, more preferably 1.0 to 50% by mass, and even more preferably 2.0 to 50% by mass to the solid matter of the compound crosslinked and condensed by the acid catalyst.

Binder

The binder used in the present invention is not particularly limited, provided that it is alkali soluble, however, it is preferable to select the binder from the viewpoints of heat resistance, developability, availability, and the like.

As the alkali soluble binder, a binder which is a linear high polymeric organic substance, is soluble in organic solvent, and can be processed for development with a weak alkali aqueous solution is preferable. Examples of such a linear high polymeric organic substance include polymers which have carboxylic acid in its side chain, such as the methacrylic acid copolymer, the acrylic acid copolymer, the itaconic acid copolymer, the crotonic acid copolymer, the maleic acid copolymer, the partially esterified maleic acid copolymer, and the like as disclosed in, for example, Japanese Patent Application Laid-Open (JP-A) Nos. 59-44615, 54-34327, 58-12577, 54-25957, 59-53836, and 59-71048. Similarly, acidic cellulose derivatives which have carboxylic acid in its side chain are useful. In addition to these, a polymer with a hydroxyl group to which an acid anhydride is added, polyhydroxystyrene resins, polysiloxan resins, poly(2-hydroxyethyl (meth)acrylate), polyvinyl pyrrolidone, polyethylene oxide, polyvinyl alcohol, and the like are also useful.

The alkali soluble binder may be a copolymer of monomers having a hydrophilic property, which examples include alcoxyalkyl (meth)acrylate, hydroxyalkyl (meth)acrylate, glycerol (meth)acrylate, (meth)acrylamide, N-methylol acrylamide, secondary or tertiary alkylacrylamide, dialkylaminoalkyl (meth)acrylate, morpholine (meth)acrylate, N-vinyl pirrolidone, N-vinyl caprolactam, vinyl imidazole, vinyl triazole, methyl (meth)acrylate, ethyl (meth)acrylate, branched or straight-chain propyl (meth)acrylate, branched or straight-chain butyl (meth)acrylate, and phenoxyhydroxypropyl (meth)acrylate, and the like.

As other monomers having a hydrophilic property, monomers and the like including a tetrahydrofurfuryl group, phosphoric acid, phosphate ester, quarternary ammonium salt, ethyleneoxy chain, propyleneoxy chain, sulfonic acid and its salt, morpholinoethyl group, and the like are also useful.

Further, in view of improving a crosslinking efficiency, a polymerizable group may be included in the side chain, and polymers and the like which contain an allyl group, a (meta) acryl group, an allyloxyalkyl group, or the like in the side chain thereof are also useful. Examples of the polymers containing these polymerizable groups are given below, but not limited to these, provided that an alkali soluble group, such as α-COOH group, a —OH group, and an ammonium group, and a carbon-carbon unsaturated bond, are included therein.

For example, a compound which is obtained by reacting a compound having an epoxy ring, which has a reactivity with a —OH group, and a compound having a carbon-carbon unsaturated bond group, such as glycidyl acrylate, with a copolymer which is composed of a monomer having a —OH group, such as 2-hydroxyethylacrylate, a monomer having α-COOH group, such as methacrylic acid, and a monomer which is copolymerizable with the monomer having a —OH group and the monomer having α-COOH group, such as an acryl compound, a vinyl compound or the like, can be used. For the reaction with the —OH group, a compound having an acid anhydride, an isocyanate group, and an acryloyl group can be used in place of the epoxy ring. Further, a reaction product which is obtained by reacting a saturated- or unsaturated-polybasic acid anhydride with a compound obtained by reacting a compound having an epoxy ring with an unsaturated carboxylic acid, such as acrylic acid, as disclosed in Japanese Patent Application Laid-Open (JP-A) No. 6-102669 and 6-1938 can also be used.

Examples of a compound which has both an alkali soluble group, such as α-COOH group, and a carbon-to-carbon unsaturated group include DIANAL NR series (trade name, manufactured by Mitsubishi Rayon Co., Ltd.), —COOH group containing polyurethane acrylic oligomer (trade name: PHOTOMER 6173, manufactured by Diamond Shamlock Co., Ltd.), VISCOTE R-264 and KS RESIST 106 (both trade names, manufactured by Osaka Organic Chemical Industry Ltd.), CYCLOMER P series and PRAXEL CF200 series (both trade names, manufactured by Daicel Company Ltd.), EBECRYL 3800 (trade name, manufactured by Daicel-UCB Company Ltd.), and the like.

Among these various binders, preferable examples of the alkali soluble binder to be used in the present invention from the viewpoint of heat resistance include a polyhydroxystyrene resin, polysiloxane resin, (meth)acryl resin, acrylamide resin, and acryl/acrylamide copolymer resin, and particularly preferable examples (meth)acryl resin, polyhydroxystyrene resin, and polysiloxane resin of the alkali soluble binder to be used in the present invention. In addition, from the viewpoint of control of developability, a (meth)acryl resin, acrylamide resin, and acryl/acrylamide copolymer resin are preferable. As the (meth)acrylic resin, a copolymer consisting of monomers selected from a benzyl (meth)acrylate, (meth)acryl acid, hydroxyethyl (meth)acrylate, (meth)acrylamide and the like, (meth)acrylic resins having a polymerizable side-chain, such as CYCLOMER P series, PRAXEL CF200 series (both trade names, manufactured by Daicel Company Ltd.), EBECRYL 3800 (trade name, manufactured by Daicel-UCB Company Ltd.), DIANAL NR series (trade name, manufactured by Mitsubishi Rayon Co., Ltd.), VISCOTE R264, KS RESIST 106 (both trade names, manufactured by Osaka Organic Chemical Industry Ltd.), or the like are preferable.

In addition, in view of enhancing a strength of a cured film, alcohol-soluble nylon, polyether formed from 2,2-bis-(4-hydroxyphenyl)-propane and epichlorhydrine, and the like are also useful.

In addition, examples of the binder to be used in the present invention include an alkali soluble phenolic resin. The alkali soluble phenolic resin can be preferably used when the composition of the present invention is rendered to be a positive composition. Examples of the alkali soluble phenolic resin include a novolak resin, a vinyl copolymer, and the like.

Examples of the novolak resin include a novolak resin which is obtained by condensing phenols and aldehydes in the presence of an acidic catalyst. Examples of the phenols include a phenol, crezol, ethyl phenol, butyl phenol, xylenol, phenyl phenol, catechol, rezorcinol, pyrogallol, naphthol, bisphenol A, and the like. The phenols can be used alone or in combination of two or more of them. Examples of the aldehydes include a formaldehyde, paraformaldehyde, acetaldehyde, propyonic aldehyde, benzaldehyde, and the like.

Specific examples of the novolak resin include a condensation product of a metacrezol, paracrezol, or a mixture of these and formalin. A molecular weight distribution of the novolak resin may be adjusted by means such as fractionation. In addition, a low-molecular weight component having a phenolic hydroxyl group, such as bisphenol C or bisphenol A, may be mixed with the novolak resin.

From the viewpoint of developability, liquid viscosity, and the like, the binder is preferably a copolymer having a weight average molecular weight (a polystyrene-converted value measured by the GPC method) of 1,000 to $2\times10^5$, more preferably of 2,000 to $1\times10^5$; and particularly preferably of 3,000 to $5\times10^4$.

In the case the composition of the invention contains a binder, the content of the binder in the composition of the invention is so determined as to satisfy the Condition (1) and it is preferably 0 to 55% by mass, more preferably 0 to 50% by mass, and even more preferably 0 to 45% by mass to the total solid matter of the composition of the invention.

Also, in the case the composition of the invention contains a binder, it satisfies 2<[the mass of cross-linking agent/the mass of binder]. The ratio [the mass of cross-linking agent/the mass of binder] satisfies preferably 2<[the mass of cross-linking agent/the mass of binder]<∞, more preferably 2.5<[the mass of cross-linking agent/the mass of binder]<∞, and even preferably 3<[the mass of cross-linking agent/the mass of binder]<∞.

Solvent

The solvent to be used with the present invention is not basically particularly limited, provided that the requirements for solubility and coatability of the composition are met, however, it is preferable that the solvent is selected in consideration of the solubility, coatability, and safety of dyes and binders.

Preferable examples of the solvent to be used in preparing the composition of the present invention includes esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methoxy methylacetate, methoxy ethylacetate, methoxy butylacetate, ethoxy methylacetate, ethoxy ethylacetate, 3-oxypropionic acid alkyl esters such as methyl 3-oxypropionate or ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanate, or ethyl 2-oxobutanate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, or propylene glycol propyl ether acetate; ketones such as methylethyl ketone, cyclohexane, 2-heptanone, or 3-heptanone; and aromatic hydrocarbons such as toluene and xylene.

Among these, as the solvent to be used in the present invention, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexane, ethyl carbitol acetate, butyl carbitol acetate, propylene glycol methyl ether, propylene glycol methyl ether acetate and the like are more preferable.

Variety of additives, such as fillers, high-molecular compounds other than the ones, surfactants, adherence promotors, oxidization inhibitors, ultraviolet absorbers, aggregation inhibitors and the like can be compounded to the composition of the present invention.

Specific examples of these additives include fillers such as glasses or alumina; high-molecular compounds other than binder resins such as polyvinyl alcohol, polyacrylic acid, polyethylene glycol monoalkyl ether, or polyfluoroalkyl acrylate; surfactants such as nonionic surfactants, cationic surfactants, or anionic surfactants; adhesion promotors such as vinyl trimethoxysilane, vinyl triethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane; oxidation inhibitors such as 2,2-thiobis(4-methyl-6-t-butylphenol) or 2,6-di-t-butylphenol; ultraviolet absorbers such as 2-(3-t-butyl-5-methyl-2-hydroxyphenol)-5-chlorobenzotriazole or alcoxybenzophenone; and aggregation inhibitors such as sodium polyacrylate.

Further, when a promotion of an alkali solubility of a radiation unirradiated portion is intended for further improvement in a developability of the composition of the present invention, an organic carboxylic acid, preferably a low-molecular weight organic carboxylic acid having a molecular weight of 1000 or less, can be added to the composition of the present invention. Specific examples of the organic carboxylic acid include aliphatic monocarboxylic acids such as formic acid, acetic acid, propionic acid, lactic acid, valeric acid, pivalic acid, caproic acid, diethylacetic acid, enanthic acid, or caprylic acid; aliphatic dicarboxylic acids such as oxalic acid, malonic acid, succinic acid, glutaric acid, adipic acid, pimelic acid, suberic acid, azelaic acid, sebacic acid, brasylic acid, methylmalonic acid, dimethylmalonic acid, methylsuccinic acid, tetramethylsuccinic acid, or citraconic acid; aliphatic tricarboxylic acids such as tricarballylic acid, aconitic acid, or camphoronic acid; aromatic monocarboxylic acids such as benzoic acid, toluic acid, cuminic acid, hemellitic acid, or mesitylenic acid; aromatic polycarboxylic acids such as phthalic acid, isophthalic acid, terephthalic acid, trimellitic acid, trimesic acid, mellophanic acid, or pyromellitic acid; and other carboxylic acids such as phenylacetic acid, hydratropic acid, hydrocinnamic acid, mandelic acid, phenylsuccinic acid, atropic acid, cinnamic acid, methyl cinnamate, benzyl cinnamate, cinnamylidene acetic acid, coumaric acid, or unbellic acid.

The content of the solvent in the composition of the invention is preferably 10 to 90% by mass and more preferably 10 to 80% by mass in the total weight of the composition from a viewpoint of solubility of the components, stability with the lapse of time, and coatability.

Color Filter

The color filter of the invention is manufactured by using the composition of the invention. That is, the color filter of the invention contains at least the colorant, the cross-linking agent, the photosensitive agent, and if necessary the binder.

The thickness of the color filter of the invention is preferably 0.1 µm to 1.5 µm, more preferably 0.2 µm to 1.4 µm, furthermore preferably 0.3 µm to 1.3 µm, and even more preferably 0.4 µm to 1.2 µm from a viewpoint of device fabrication.

Further, the color filter of the invention is preferable to have chromaticity change (ΔE*ab) of 20 or less by heat and light. If the chromaticity change (ΔE*ab) by heat and light is 20 or less, the production suitability and storage stability of a product can be improved. The chromaticity change (ΔE*ab) by heat and light is preferably 0 to 18, more preferably 0 to 15, and even more preferably 0 to 13.

The color filter of the present invention can be manufactured by coating the composition of the present invention on a support by using a coating method, such as a spin coating, a casting coating, or a roll coating, to form a radiation-sensitive composition layer, exposing the resultant to light through a prescribed mask pattern, and developing the resultant with a developing solution to form a colored pattern. Further, the manufacturing method for the color filter of the present invention may include a process for curing the resist pattern by heating and/or exposing to light, in accordance with necessity. Moreover, the process for curing by heating and/or exposing to light may be carried out a plurality of times.

Preferable examples of the radiation used in this case include ultraviolet radiation such as g-ray, h-ray or i-ray.

Examples of the support include soda glass, PYREX® glass, silica glass, and these to which a transparent electrically conductive film is deposited; a photoelectric transducer substrate such as a silicone substrate, which is used in image pickup elements or the like; a complementary metal oxide semiconductor (CMOS), and the like. Black stripes for optically isolating the respective pixels may be formed on these supports.

Further, in view of improving adherence the substrate to the upper layer, preventing substance diffusion, and/or flattening the substrate surface, an undercoating layer may be provided on the support in accordance with necessity.

Any developing solution can be used as the developing solution involved in the manufacturing method for the color filter of the present invention, provided that it is a composition which dissolves the composition of the present invention, but do not dissolve radiation-irradiated portions. Specific examples thereof include a combination of various organic solvents and alkaline aqueous solutions.

Examples of the organic solvents include the solvents which are used in preparing the composition of the present invention.

Examples of the alkaline aqueous solution include an alkaline aqueous solution in which an alkaline compound such as sodium hydroxide, potassium hydroxide, sodium carbonate, sodium silicate, sodium metasilicate, ammonia water, ethylamine, diethylamine, dimethylethanolamine, tetramethylammoniumhydroxide, tetraethylammoniumhydroxide, choline, pyrrole, piperidine or 1,8-diazabicyclo-[5.4.0]-7-undecene is dissolved such that a concentration thereof becomes 0.01 to 10% by mass, preferably 0.01 to 1% by mass. When a developing solution consisting of such an alkaline aqueous solution is used, the color filter is generally cleaned with water after a development.

Further, the color filter of the present invention can be used for solid image pickup elements such as a liquid crystal display device or a CCD, and is particularly suited for use with CCDs and CMOSs which have a high resolution of over one million pixels, and the like. The color filter of the present invention can be used as a color filter to be disposed between the light receiving part of the respective pixels constituting the CCD and condensing microlenses, for example.

EXAMPLES

Hereinafter, the present invention will be more specifically described with examples. However, the present invention is not limited by the following examples, in other words, other forms of the invention may be produced within the spirit or scope of the invention as defined in the appended claims. In the following description, the words "part" and "%" are used based on mass unless otherwise noted.

Example 1

1) Preparation of Resist Solution

The following compositions were mixed and dissolved to prepare a resist solution. Compositions for resist solution

| | |
|---|---|
| Propyleneglycolmonomethyl ether acetate (PGMEA) | 19.00 parts |
| Ethyl lactate | 36.00 parts |
| Cyclohexanone | 0.87 parts |
| Binder (PGMEA solution containing 41% of acrylmethacrilate/methacrylic acid copolymer (molar ratio = 65:35)) | 30.51 parts |
| Dipentaerythritolhexacrilate | 12.20 parts |
| Polymerization inhibitor (p-methoxyphenol) | 0.0075 parts |
| Fluorine surfactant (trade name: MEGAFACE ® F177P, 0.2% ethyl lactate solution, manufactured by Dainippon Ink And Chemicals, Inc.) | 0.95 parts |
| 2-(O-benzoyloxime)-1-[4-(phenylthio)phenyl]-1,2-octanedion (photopolymerization initiator) | 0.600 parts |

2) Preparation of Glass Substrate Having Undercoating Layer

A glass substrate (trade name: CORNING 1737, manufactured by Corning Inc.) was ultrasonically washed with 1% NaOH water, which was then followed by water washing and dehydration baking (for 30 min at 200° C.).

Next, the resist solution was applied to the washed glass substrate to provide a film thickness of 2 µm by a spin coater, and heated to be dried for 1 hr at 220° C. for formation of a cured film to obtain a glass substrate having an undercoating layer.

3) Preparation of Colorant-Containing Resist Solution

The following composition was dissolved by mixing to prepare a colorant-containing resist solution.

[Composition of the Colorant-Containing Resist Solution]
Binder solution (Cyclohexanone solution of 20% (benzyl methacrylate/methacrylic acid) copolymer (mole ratio=70:30) (as a polymer, 0.129 part)) 0.645 parts;
Dipentaerythritol hexacrylate (polymerizable compound) 0.516 parts;
The following colorant (I) 0.70 parts;
2-(O-Benzoyloxime)-1-[4-(phenylthio)phenyl]-1,2-octanedione (photopolymerization initiator) 0.056 parts; and
Cyclohexanone (solvent) 4.57 parts.

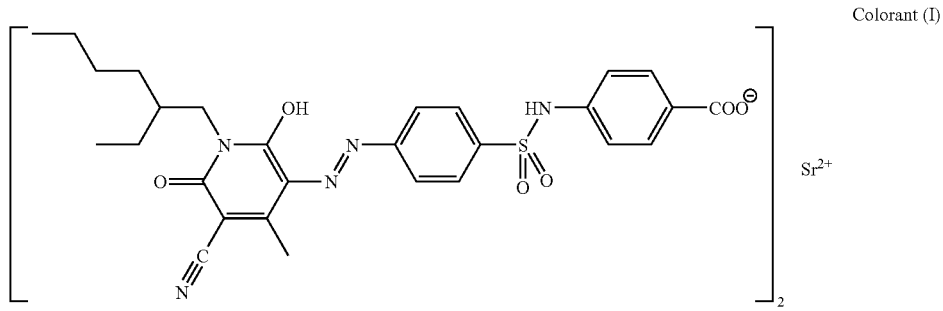

Colorant (I)

4) Light Exposure and Development Processing of Colorant-Containing Resist

Image Formation

The dye resist solution obtained in the above paragraph 3) was applied to the undercoating layer of the glass substrate having an undercoating layer obtained in the above paragraph 2) to provide a film thickness of 1.0 µm by using a spin coater, and prebaked for 120 sec at 120° C.

Next, by using an exposing apparatus, the coated film was irradiated at an amount of exposure of 800 mJ/cm$^2$ with a wavelength of 365 nm through a mask having a thickness of 20 µm. After the exposure, the coated film was processed for development under the conditions of 26° C. and 60 sec by using a developing solution (trade name: CD-2000; concentration: 60%, manufactured by FUJIFILM Arch Co., Ltd.) Thereinafter, the coated film was rinsed for 20 sec with running water, which was then followed by spray drying for image formation.

In the present example, the image formation was verified in the normal way by using an optical microscope and SEM photographic observation.

Evaluation (1) Developability of the Unexposed Parts and Percentage of Film Remaining in the Exposed Parts The "developability of the unexposed parts" and "percentage of film remaining in the exposed part" was measured by a color meter (trade name: MCPD-1000, manufactured by Otsuka Electronics Co., Ltd.).

The "developability of the unexposed parts" refers to the rate of change in absorbance for the film before and after the development, and for a light sensitive negative composition, the greater the value, the better. Further, the "percentage of film remaining in the exposed part" refers to the ratio of maintained light absorbance for the film before and after development, and for a light sensitive negative composition, the greater the value, the better.

That the developability of the unexposed part and the percentage of film remaining in the exposed part are both high values means that pattern formability is good.

(2) Heat Resistance

In the present example, the "heat resistance" was determined by heating the glass substrate coated with a dye resist solution for 1 hr at 200° C. by use of a hot plate, and then measuring the change in chromaticity, i.e., the Δ Eab value, with a chromoscope (trade name: MCPD-1000, manufactured by Otsuka Electronics Co., Ltd.). The smaller the Δ Eab value, the higher the heat resistance.

(3) Light Fastness

The "light fastness" was determined by irradiating the glass substrate coated with a dye resist solution with a Xenon lamp at 200,000 lux for 10 hours (equivalent to 2,000,000 lux hours), and then measuring the change in chromaticity, i.e., the Δ Eab value. The smaller the Δ Eab value, the higher the light fastness.

(4) Molar Absorbance Coefficient (ε)

The molar absorbance coefficient (ε) was calculated from the absorbance in methanol. As the color value, the value obtained by dividing the molar absorbance coefficient (ε) by the Mw of the dye, i.e., ε/Mw was used.

Table 1 gives the results of these.

Examples 2 to 8

The image was formed in the same way as in Example 1, and the evaluation was carried out in the same manner except that, the colorant was substituted by the compounds as shown in Table 1 below. The results are given in Table 1 below.

Example 9

An image was formed in the same manner as Example 1, except that the photopolymerization initiator was changed to "TAZ-107 (manufactured by Midori Kagaku Co., Ltd.) in the preparation of the resist solution of 1) in Example 1 and the image was evaluated similarly. The results are shown in Table 1.

Example 10

An image was formed in the same manner as Example 1, except that the photopolymerization initiator was changed to 2-benzyl-2-dimethylamino-4-morpholinobutylophenone in the preparation of the resist solution of 1) in Example 1 and the image was evaluated similarly. The results are shown in Table 1.

Examples 11 to 20

Except that the glass substrate in Examples 1 to 10 was substituted by a silicone wafer substrate, the image was formed in the same way as in Example 1. For the developability of the unexposed part and the film remaining percentage for the exposed part, the same results as in Examples 1 to 10 were obtained.

Examples 11 to 20 use a silicone wafer substrate, and thus they are different from Examples 1 to 10 in the substrate used, but since the colorant resist solution is coated on the undercoating layer throughout Examples 1 to 20, thus there arises no substantial difference, resulting in the same performances having been obtained.

Comparative Example 1

An image was formed in the same manner as Example 1, except that the composition of the colorant-containing resist solution was changed as follows in the preparation of the colorant-containing resist solution in 3) of Example 1 and the image was evaluated similarly. The results are shown in Table 1.

[Composition of the Colorant-Containing Resist Solution of Comparative Example 1]

Binder solution (Cyclohexanone solution of 20% (benzyl methacrylate/methacrylic acid) copolymer (mole ratio=70:30) (as a polymer, 0.258 parts)) 1.29 parts;

Dipentaerythritol hexacrylate (polymerizable compound) 0.387 parts;

The colorant (I) below 0.70 parts;

2-(O-Benzoyloxime)-1-[4-(phenylthio)phenyl]-1,2-octanedione (photopolymerization initiator) 0.056 parts; and Cyclohexanone (solvent) 4.57 parts.

Example 21

An image was formed in the same manner as Example 1, except that the composition of the colorant-containing resist solution was changed as follows in the preparation of the colorant-containing resist solution in 3) of Example 1 and the image was evaluated similarly. The results are shown in Table 1.

[Composition of the Colorant-Containing Resist Solution]

The colorant (I) below 16 parts;

α-(4-Toluenesulfonyloxyimino)phenylacetonitrile (photo-acid generator) 0.5 parts;

Hexamethoxymethylmelamine (cross-linking agent) 12.5 parts;

Ethyl lactate (solvent) 70 parts; and p-Cresol novolak resin (molecular weight 5000) (binder) 6.0 parts.

TABLE 1

| | Colorant | Developability of the unexposed parts (%) | Percentage of film remaining in the exposed parts (%) | Heat resistance ΔE*ab (200° C./1 h) | Light fastness ΔE*ab (2 Mlux/1 h) | ε (l·mol$^{-1}$cm$^{-1}$) | color value (ε/Mw) | content ratio (1) | content ratio (2) |
|---|---|---|---|---|---|---|---|---|---|
| Ex. 1 | colorant (I) | 100 | 99 | 2.25 | 2.35 | 45000 | 66.4 | 0.5 | 4.0 |
| Ex. 2 | mixture of C.I. Solvent Orange 56 and the colorant (I) at 1.0:1.0 (by mass) | 100 | 98 | 3.35 | 3.25 | — | — | 0.5 | 4.0 |
| Ex. 3 | mixture of C.I. Solvent Blue 38 and the colorant (I) at 1.0:1.0 (by mass) | 100 | 97 | 3.55 | 3.65 | — | — | 0.5 | 4.0 |
| Ex. 4 | mixture of C.I. Solvent Violet 8 and the colorant (I) at 1.0:1.0 (by mass) | 100 | 95 | 4.55 | 5.25 | — | — | 0.5 | 4.0 |
| Ex. 5 | mixture of C.I. Solvent Blue 68 and the colorant (I) at 1.0:1.0 (by mass) | 100 | 93 | 5.15 | 5.45 | — | — | 0.5 | 4.0 |
| Ex. 6 | mixture of Acid Red 143 and the colorant (I) at 1.0:1.0 (by mass) | 100 | 92 | 5.35 | 5.65 | — | — | 0.5 | 4.0 |
| Ex. 7 | mixture of C.I. Solvent Yellow 82 and the colorant (I) at 1.0:1.0 (by mass) | 100 | 91 | 5.45 | 5.85 | — | — | 0.5 | 4.0 |
| Ex. 8 | mixture of C.I. Solvent Yellow 162 and the colorant (I) at 1.0:1.0 (by mass) | 100 | 95 | 15.00 | 3.25 | — | 80 | 0.5 | 4.0 |
| Ex. 9 | colorant (I) | 100 | 99 | 4.65 | 4.85 | 45000 | 66.4 | 0.5 | 4.0 |
| Ex. 10 | colorant (I) | 100 | 97 | 4.15 | 4.05 | 45000 | 66.4 | 0.5 | 4.0 |
| Comp. Ex. 1 | colorant (I) | 100 | 15 | 6.25 | 7.15 | 45000 | 66.4 | 0.5 | 1.5 |
| Ex. 21 | colorant (I) | 100 | 95 | 5.35 | 5.25 | 45000 | 66.4 | 0.45 | 2.1 |

Note:

The colorants in Table 1 can be classified in the following types, respectively.

Colorant (I): (pyridone)azo-based acidic dye derivative;

C.I. Solvent Orange 56: xanthene-based dye;

C.I. Solvent Blue 38: copper-phthalocyanine-based dye;

C.I. Solvent Violet 8: triarylmethane-based dye;

C.I. Solvent Blue 68: anthraquinone-based dye;

Acid Red 143: anthrapyridone-based dye;

C.I. Solvent Yellow 82: pyrazolone azo-based dye; and

C.I. Solvent Yellow 162: pyridone azo-based dye in the

Furthermore the content ratios (1) and (2) in Table 1 respectively show as follows.

Content ratio (1): the mass of colorant/[the mass of colorant + the mass of cross-linking agent + the mass of the photosensitive agent + the mass of the binder] and Content ratio (2): the mass of the cross-linking agent/the mass of the binder.

As shown in Table 1, it has conventionally been difficult to simultaneously satisfy the properties shown in Table 1 just like the case of Comparative Examples. However, use of the colorant-containing curable composition according to the invention makes it possible to obtain a curable composition excellent in the heat resistance, light fastness, and color value (ε/Mw) of the colorant, and curability of the composition. Also, at the same time, the developability of the unexposed part and the percentage of film remaining in the exposed parts are improved and thus the composition is found excellent in the pattern formability.

The curable composition of the invention particularly has an improved curability and pattern formability, so that the film thickness can be reduced even in the case a high film absorbance is required.

Further, as is clear from the results of Table 1, the crosslink density in the film is low in the case of Comparative Example 1 in which the content ratio (2) is as low as (the mass of the cross-linking agent/the mass of the binder)=1.5 and the percentage of film remaining in the exposed parts cannot be maintained.

From the findings, it is proved that the colorant-containing curable composition of the invention is superior.

According to the invention, a curable composition excellent in the heat resistance, light fastness, and molar absorption coefficient (color value) of the colorant is obtained by using a colorant-containing curable composition of the invention. Especially, use of a dye with a high color value makes it possible to lower the addition amount of the dye and accordingly improve various properties of the resist. At the same time, the invention provides a colorant-containing curable composition having improved developability of the unexposed part and percentage of film remaining in the exposed parts and accordingly good pattern formability.

The invention also provides a colorant-containing curable composition with high productivity since it is free of a risk of deterioration of various properties in the manufacturing process and accordingly provides thin film type color filter using the composition.

The invention also provides a simple manufacturing method with a high cost performance by using the colorant-containing curable composition.

According to the invention, a colorant-containing curable negative-type composition having the following characteristics is provided and consequently, the composition has accomplished the aim of the invention.

That is, the invention provides:

<1>. A colorant-containing curable negative-type composition comprising; at least a colorant, a cross-linking agent, and a photosensitive agent, and satisfying the following Condition (1) relevant to the mass of the respective components in the case the composition further contains a binder, and satisfying the following Condition (2) relevant to the mass of the respective components in the case the composition does not contain a binder:

Condition (1): wherein the mass of the binder >0, $0.45 \leq$ the mass of the colorant/[the mass of the colorant+the mass of the cross-linking agent+the mass of the photosensitive agent+the mass of the binder]<1.0 and 2<[the mass of the cross-linking agent/the mass of the binder]; and Condition (2): wherein the mass of the binder=0, $0.45 \leq$ the mass of the colorant/[the mass of the colorant+the mass of the cross-linking agent+the mass of the photosensitive agent]<1.0.

<2>. The colorant-containing curable negative-type composition of <1>, wherein the colorant comprises at least one compound selected from an azo-based compound, a xanthene-based compound, a phthalocyanine-based compound, a triarylmethane-based compound, an anthraquinone-based compound, a quinophthalone-based compound, and an anthrapyridone-based compound.

<3>. The colorant-containing curable negative-type composition of <1>, wherein the colorant comprises at least one acidic dye.

<4>. The colorant-containing curable negative-type composition of <1>, wherein a color value (molar absorption coefficient/molecular weight) of the colorant is 15 or more.

<5>. The colorant-containing curable negative-type composition of <1>, wherein a color value (molar absorption coefficient/molecular weight) of the colorant is 35 or more.

<6>. The colorant-containing curable negative-type composition of <1>, wherein the colorant comprises at least one material selected from a copper-phthalocyanine coloring material, a pyridone-azo coloring material, a pyrazolone-azo coloring material, a triarylmethane coloring material, a quinophthalone-based coloring material, and a xanthene-based compound coloring material.

<7>. The colorant-containing curable negative-type composition of <1>, wherein the photosensitive agent is a photopolymerization initiator.

<8>. The colorant-containing curable negative-type composition of <1>, wherein the photosensitive agent is a photo-acid generator.

<9>. The colorant-containing curable negative-type composition of <1>, wherein the cross-linking agent comprises a (meth)acrylic ester-based monomer.

<10>. The colorant-containing curable negative-type composition of <1>, wherein the cross-linking agent comprises a tetra- or more-functional (meth)acrylic ester-based monomer.

<11>. The colorant-containing curable negative-type composition of <1>, wherein the binder comprises an alkali-soluble (meth)acrylic resin.

<12>. The colorant-containing curable negative-type composition of <1>, wherein the binder comprises an alkali-soluble (meth)acrylic resin having a polymerizable side chain.

<13>. The colorant-containing curable negative-type composition of <1>, wherein the photosensitive agent comprises at least one compound selected from the group consisting of a trihalomethyltriazine-based compound, a benzyldimethyl ketal compound, an α-hydroxyketone compound, an α-aminoketone compound, a phosphine oxide-based compound, a metallocene compound, an oxime-based compound, a triarylimidazole dimer, a benzothiazole-based compound, a benzophenone compound, an acetophenone compound and derivatives thereof, a cyclopentadiene-benzene-iron complex and salts thereof, a halomethyloxadiazole compound, and a 3-aryl-substituted cumarin compound.

<14>. The colorant-containing curable negative-type composition of <1>, wherein the photosensitive agent comprises at least one compound which does not generate an acid by decomposition.

<15>. The colorant-containing curable negative-type composition of <1>, wherein the photosensitive agent comprises at least one compound selected from the group consisting of an α-aminoketone compound, a phosphine oxide-based compound, a metallocene compound, an oxime-based compound, and a triarylimidazole dimer.

<16>. The colorant-containing curable negative-type composition of <1>, wherein the cross-linking agent comprises a thermal cross-linking agent.

<17>. A color filter obtained by using the colorant-containing curable negative-type composition of <1>.

<18>. The color filter of <17>, wherein a film thickness of the color filter is 0.1 μm to 1.5 μm.

<19>. The color filter of <17>, wherein a chromaticity change (ΔE*ab) of the color filter by heat and light is 20 or less.

<20>. A method of manufacturing a color filter comprising applying the colorant-containing curable negative-type composition of <1> to a support, exposing the composition through a mask, and developing the composition for to form patterns.

What is claimed is:

1. A colorant-containing curable negative-type composition comprising: at least a colorant, a cross-linking agent, and a photosensitive agent, and satisfying the following Condition (1) relevant to the mass of the respective components in the case the composition further contains a binder, and satisfying the following Condition (2) relevant to the mass of the respective components in the case the composition does not contain a binder:

Condition (1): wherein the mass of the binder>0,
0.45≦the mass of the colorant/[the mass of the colorant+ the mass of the cross-linking agent+the mass of the photosensitive agent+the mass of the binder]<1.0 and 2<[the mass of the cross-linking agent/the mass of the binder]; and Condition (2): wherein the mass of the binder=0,
0.45≦the mass of the colorant/[the mass of the colorant+ the mass of the cross-linking agent+the mass of the photosensitive agent]<1.0,
wherein a color value (molar absorption coefficient/molecular weight) of the colorant is 15 or more.

2. The colorant-containing curable negative-type composition of claim 1, wherein the colorant comprises at least one compound selected from the group consisting of an azo-based compound, a xanthene-based compound, a phthalocyanine-based compound, a triarylmethane-based compound, an anthraquinone-based compound, a quinophthalone-based compound, and an anthrapyridone-based compound.

3. The colorant-containing curable negative-type composition of claim 1, wherein the colorant comprises at least one acidic dye.

4. The colorant-containing curable negative-type composition of claim 1, wherein a color value (molar absorption coefficient/molecular weight) of the colorant is 35 or more.

5. The colorant-containing curable negative-type composition of claim 1, wherein the colorant comprises at least one material selected from the group consisting of a copper-phthalocyanine coloring material, a pyridone-azo coloring material, a pyrazolone-azo coloring material, a triarylmethane coloring material, a quinophthalone-based coloring material, and a xanthene-based compound coloring material.

6. The colorant-containing curable negative-type composition of claim 1, wherein the photosensitive agent is a photopolymerization initiator.

7. The colorant-containing curable negative-type composition of claim 1, wherein the photosensitive agent is a photoacid generator.

8. The colorant-containing curable negative-type composition of claim 1, wherein the cross-linking agent comprises a (meth)acrylic ester-based monomer.

9. The colorant-containing curable negative-type composition of claim 1, wherein the cross-linking agent comprises a tetra- or more-functional (meth)acrylic ester-based monomer.

10. The colorant-containing curable negative-type composition of claim 1, wherein the binder comprises an alkali-soluble (meth)acrylic resin.

11. The colorant-containing curable negative-type composition of claim 1, wherein the binder comprises an alkali-soluble (meth)acrylic resin having a polymerizable side chain.

12. The colorant-containing curable negative-type composition of claim 1, wherein the photosensitive agent comprises at least one compound selected from the group consisting of a trihalomethyltriazine-based compound, a benzyldimethyl ketal compound, an α-hydroxyketone compound, an α-aminoketone compound, a phosphine oxide-based compound, a metallocene compound, an oxime-based compound, a triarylimidazole dimer, a benzothiazole-based compound, a benzophenone compound, an acetophenone compound and derivatives thereof, a cyclopentadiene-benzene-iron complex and salts thereof, a halomethyloxadiazole compound, and a 3-aryl-substituted cumarin compound.

13. The colorant-containing curable negative-type composition of claim 1, wherein the photosensitive agent comprises at least one compound which does not generate an acid by decomposition.

14. The colorant-containing curable negative-type composition of claim 1, wherein the photosensitive agent comprises at least one compound selected from the group consisting of an α-aminoketone compound, a phosphine oxide-based compound, a metallocene compound, an oxime-based compound, and a triarylimidazole dimer.

15. The colorant-containing curable negative-type composition of claim 1, wherein the cross-linking agent comprises a thermal cross-linking agent.

16. A color filter obtained by using the colorant-containing curable negative-type composition of claim 1.

17. The color filter of claim 16, wherein a film thickness of the color filter is 0.1 μm to 1.5 μm.

18. The color filter of claim 16, wherein a chromaticity change (ΔE*ab) of the color filter by heat and light is 20 or less.

19. A method of manufacturing a color filter comprising applying the colorant-containing curable negative-type composition of claim 1 to a support, exposing the composition through a mask, and developing the composition to form patterns.

* * * * *